(12) United States Patent
Shanbhag et al.

(10) Patent No.: US 7,609,102 B2
(45) Date of Patent: Oct. 27, 2009

(54) PATTERN-DEPENDENT PHASE DETECTOR FOR CLOCK RECOVERY

(75) Inventors: Naresh Shanbhag, Champaign, IL (US); Hyeon Min Bae, Champaign, IL (US); Jinki Park, Plano, TX (US); Paul Suppiah, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 106 days.

(21) Appl. No.: 11/420,196

(22) Filed: May 24, 2006

(65) Prior Publication Data

US 2009/0237138 A1 Sep. 24, 2009

Related U.S. Application Data

(60) Provisional application No. 60/684,195, filed on May 24, 2005.

(51) Int. Cl.
*H03H 11/16* (2006.01)
(52) U.S. Cl. .............. 327/231; 327/3; 327/12; 327/237; 327/243; 375/371; 375/373; 375/375
(58) Field of Classification Search ........ 327/3, 327/5, 7, 9, 12, 94, 231–233, 236, 237, 243, 327/244; 375/371, 373, 375, 376
See application file for complete search history.

(56) References Cited

U.S. PATENT DOCUMENTS

| | | | |
|---|---|---|---|
| 6,127,897 A * | 10/2000 | Sasaki | 331/25 |
| 6,262,611 B1 | 7/2001 | Takeuchi | 327/159 |
| 6,316,966 B1 * | 11/2001 | Chang et al. | 327/2 |
| 6,347,128 B1 * | 2/2002 | Ransijn | 375/376 |
| 6,421,404 B1 * | 7/2002 | Nakamura | 375/354 |
| 6,538,475 B1 * | 3/2003 | Johansen et al. | 327/12 |
| 6,594,331 B1 | 7/2003 | Soda | |
| 6,711,220 B1 * | 3/2004 | Yoshida et al. | 375/354 |
| 6,801,592 B1 * | 10/2004 | Christensen | 375/375 |
| 6,888,906 B2 | 5/2005 | Muellner et al. | 375/375 |
| 7,027,544 B2 * | 4/2006 | Vaucher | 375/355 |
| 7,068,086 B2 * | 6/2006 | Takeda | 327/161 |
| 7,386,084 B2 * | 6/2008 | Yin | 375/371 |
| 2003/0091139 A1 * | 5/2003 | Cao | 375/376 |
| 2004/0062336 A1 | 4/2004 | Kuwata et al. | 375/376 |

OTHER PUBLICATIONS

International Search Report for application No. PCT/US2006/020770.

* cited by examiner

*Primary Examiner*—Lincoln Donovan
*Assistant Examiner*—Patrick O'Neill
(74) *Attorney, Agent, or Firm*—Workman Nydegger

(57) ABSTRACT

A phase detector apparatus and method used for clock recovery from a data signal is provided. The phase detector provides phase correction signals to a clock signal generator, where the phase correction signals are only generated if a predetermined data sample pattern is observed. In particular, the predetermined data sample pattern is preferably a transition from one to zero. Thus, transitions from zero to one will not provide a valid phase update output signal, even though a transition has occurred. In other embodiments the predetermined data sample pattern is preferably a one to zero transition preceded by an additional logic one sample.

20 Claims, 3 Drawing Sheets

PATTERN-DEPENDENT PHASE DETECTOR FOR CLOCK RECOVERY

CROSS-REFERENCE TO RELATED APPLICATIONS

The present application claims priority to U.S. Provisional Application No. 60/684,195, entitled "Clock Data Recovery Architecture", filed May 24, 2005, which is hereby incorporated by reference herein in its entirety.

FIELD OF THE INVENTION

The present invention relates to a clock recovery method and apparatus used in data communication.

BACKGROUND

A typical clock recovery circuit includes a phase detector, such as that shown in FIG. 1A. The phase detector of FIG. 1A is of the type known in the art as an Alexander phase detector, or a Bang-Bang phase detector. A received data signal on line 102 is sampled by the flip-flop 106 on the rising edge of the clock signal on line 104. The data signal is again sampled on the falling edge of the clock by the flip-flop 108. On the next rising edge of the clock signal, the data signal is again sampled by flip-flop 106, while the previous samples are shifted into flip-flops 110 and 112. Thus, the data samples held in flip-flops 110, 112, 106 correspond to samples A, B, and C, respectively, as shown in FIG. 1B. If the outputs of flip-flop 106 and 110 are both the same (A=C), then the outputs of exclusive OR (XOR) gates 116, 120, are both equal to zero and no phase update occurs. On the other hand, the presence of either a falling edge (from high to low) or a rising edge (from low to high) in the data signal will result in different values for A and C (A≠C), which will validate the phase update signals.

If A and C are not the same, then the outputs depend on the value of B. If A=B, indicating that the clock is early (the falling edge of the clock occurs during the same bit time as sample A), the output 116 of XOR gate 114 is low and the output 120 of XOR gate 118 is high. And if B=C indicating that the clock is late (the falling edge of the clock occurs during the same bit time as sample C), then the logic outputs at 116 and 120 are reversed. Thus, the XOR gates 114, 118 provide the phase adjustment signals.

In optical communication systems, optical fiber transmission may induce nonlinear distortion of the signal waveform. As a result, the location of the bit transitions relative to the mid-bit position tends to vary depending on the data sequence transmitted. In addition, certain pulse sequences result in a rising edge followed by a falling edge where the edges are less than one symbol period apart. Therefore, the phase detector of FIG. 1A, and variants thereof, may have difficulty recovering an accurate clock signal due to the jitter induced by the variance in the pulse shapes. Consequently, an improvement is desired.

SUMMARY

A phase detector apparatus and method used for clock recovery from a data signal is provided. The phase detector provides phase correction signals to a clock signal generator, where the phase correction signals are only generated if a predetermined data sample pattern is observed. In particular, the predetermined data sample pattern is one specific sample sequence associated with desired timing information. The sequence may have any pattern, and be of arbitrary length. In one embodiment the predetermined data sample pattern is preferably a transition from one to zero. Thus, transitions from zero to one will not provide a valid phase update output signal, even though a transition has occurred. In other embodiments the predetermined data sample pattern is preferably a one to zero transition preceded by an additional logic one sample. In yet another alternative embodiment, the transition may be a zero-to-one transition, and one-to-zero transitions will be ignored.

In a preferred embodiment, the phase detector has a data signal sampler and digital logic circuit that identifies predetermined signal transitions and generates a pattern-dependent phase correction signal. The data signal sampler generally provides signal samples of a received data signal at twice the symbol-rate, and the sampling instant is preferably determined by a local clock signal. The samples are preferably at a rate equal to twice the symbol rate so that samples of the data signal obtained near the mid-symbol time may be compared to samples of the data signal obtained during a symbol transition time. Thus, in one preferred embodiment, at least three samples are obtained—a first and second signal sample that are separated by a symbol period, and an intervening signal sample occurring between the first and second signal samples.

The symbol-rate sampling may be performed by more than one sampling element and the samples interleaved as necessary. In one such embodiment, two flip-flop circuit elements are used: one to obtain samples on one edge of the local clock signal (e.g., the rising edge) while the other is used to obtain samples on the other edge of the clock (e.g., the falling edge). In this embodiment, the analog-to-digital converter (ADC) is a one bit converter. The threshold voltage of the flip-flop that determines whether the analog voltage is a one or zero may be configured. Indeed, the ADC may be a multi-bit converter comprising two flip-flops having different thresholds. Other ADC configurations may be used to provide signal sampling and storage in a memory element, such as standard analog to digital converters and data latches.

The phase detector also includes a digital logic circuit for processing the signal samples to ensure that a predetermined data sample pattern has been obtained. Preferably, the logic circuit compares signal samples separated by one symbol period together with an intervening signal sample to identify the occurrence of a predetermined signal transition. If the predetermined signal transition is identified, then the digital logic circuit generates a phase update (or phase correction) signal. The phase correction signal is referred to as a pattern-dependent phase correction signal because it is not generated for every signal transition that occurs, but only those that match the predetermined pattern.

In an alternative embodiment, a method of providing phase correction signals to a clock signal generator is provided. The method preferably includes the steps of (i) obtaining a received signal sample sequence; (ii) determining a relative phase between a clock signal and a received data signal in response to the received signal sample sequence; (iii) determining whether a data transition has occurred in response to the received signal sample sequence; and, (iv) determining whether the received signal sample sequence is equal to a predetermined signal sample sequence, and if so, generating a pattern dependent phase correction signal in response to the determined relative phase.

In an alternative embodiment, the method includes the steps of (i) obtaining a received signal sample sequence, wherein the signal sample sequence contains at least some multi-bit samples; (ii) determining a relative phase between a clock signal and a received data signal in response to the received signal sample sequence; (iii) determining whether a predetermined data transition has occurred in response to the multi-bit samples, and, if so, (iv) generating a pattern dependent phase correction signal in response to the determined relative phase.

These as well as other aspects, advantages, and alternatives will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

The clock recovery method and apparatus disclosed herein is able to recover a clock signal from a data signal in the presence of channel dispersion by achieving phase alignment of clock and data at the samplers inside the analog-to-digital converter (ADC), and by the design and incorporation of a fast-tracking voltage controlled oscillator (VCO) inside the phase locked loop (PLL). Details of the fast-tracking VCO are disclosed in co-pending patent application Ser. No. 11/420,195, entitled "Noise-Tolerant Voltage Controlled Oscillator", filed May 24, 2006, the contents of which are hereby incorporated herein by reference.

Figure 3A:
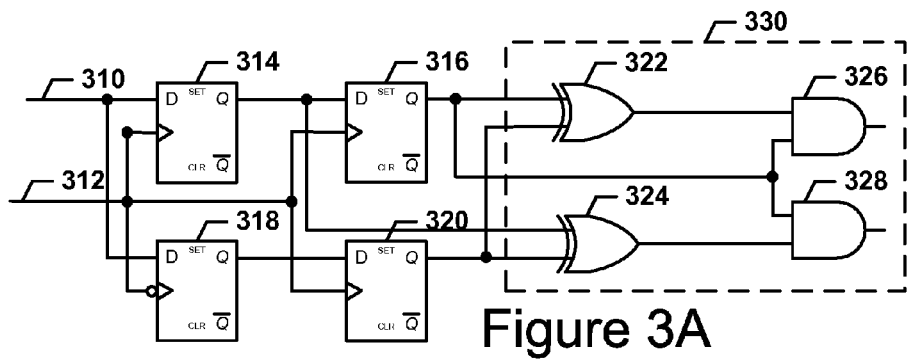
FIG. 3A is a circuit diagram depicting a preferred embodiment of the phase detector.
Figure 3B:
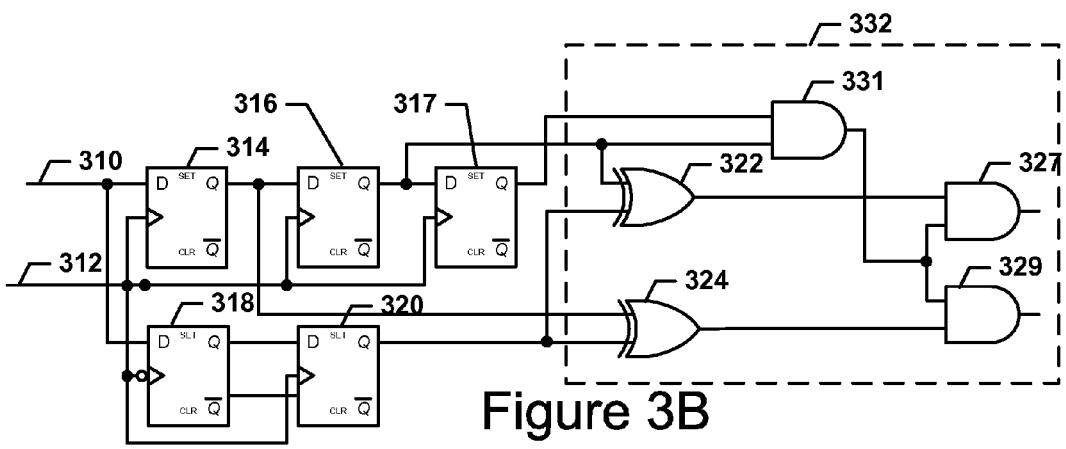
FIG. 3B is a circuit diagram depicting an alternative preferred embodiment of the phase detector.
Figure 3C:
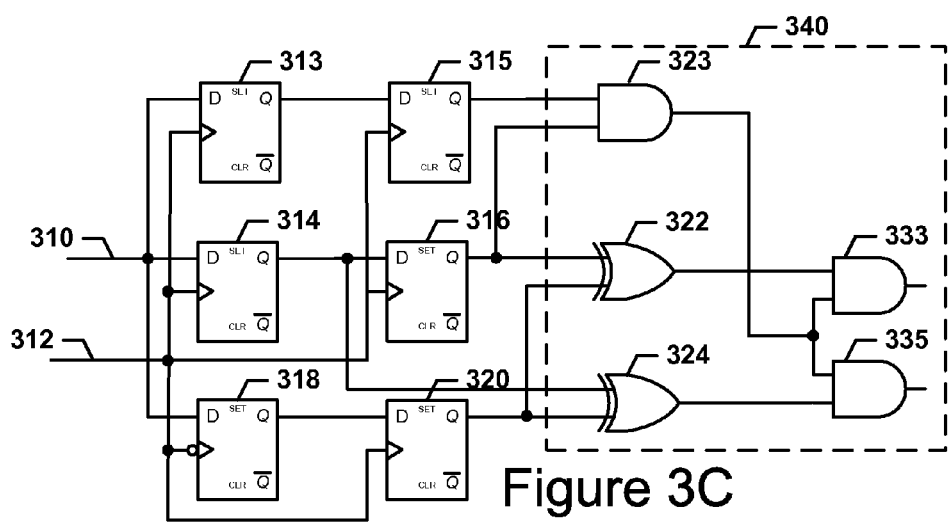
FIG. 3C is a circuit diagram depicting an alternative preferred embodiment of the phase detector.

Existing clock recovery systems are typically unable to recover the clock when optical fiber length exceeds approximately 80 km. This is because existing PLL's look for zero crossings in the received signal and lock on to it. Fiber dispersion results in non-existent zero crossings for high-frequency data patterns (01010). Thus, conventional clock recovery fails to lock when dispersion exceeds a certain amount. The clock recovery method and apparatus described herein employs a phase-detector that employs a post processing logic circuit which provides a pattern-dependent phase update. FIGS. 3A-3C show specific instances of the implementation of the post processing circuit block. This new phase detector enables the clock recovery to be robust to dispersion and operation at low optical signal-to-noise ratio (OSNR) and bit-error-rate (BER) conditions.

Figure 1A:
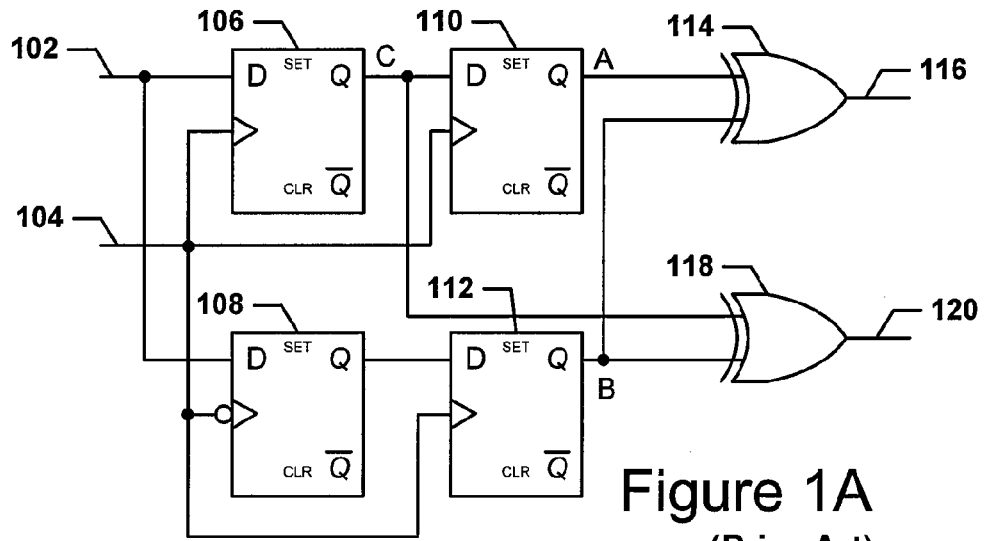
FIG. 1A is a block diagram depicting a prior art Alexander phase detector.
Figure 1B:
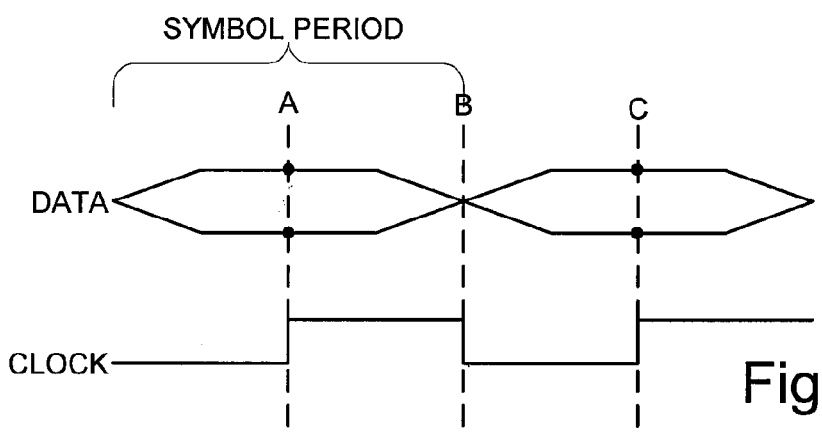
FIG. 1B is timing diagram depicting the operation of a prior art Alexander phase detector.
Figure 2:
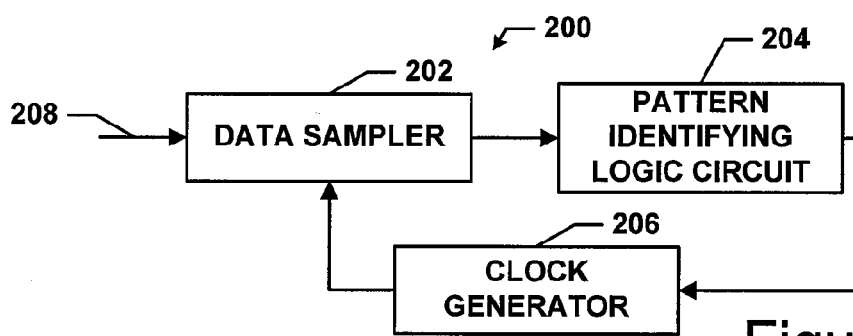
FIG. 2 is a block diagram of the preferred embodiment of the phase detector.

As shown in FIG. 2, the exemplary phase detector 200 includes a data sampler 202, a pattern-identifying logic circuit 204, and a clock generator 206. The data sampler 202 receives a data signal on line 208 that comprises the received symbols obtained from a fiber optic communication channel. The data sampler 202 provides data samples of the received signal to the pattern-identifying logic circuit 204. Based on the output of the pattern-identifying logic circuit 204, the clock generator 206 generates a local clock signal. This clock signal is used to sample the data at the data sampler 202. The data sampler 202 may take many forms, including flip-flops having a logic threshold that cause input voltages above the threshold to be latched as a logic one and input voltages below the threshold to be latched as a logic zero. The threshold may be adjusted to provide the desired quantization characteristics. Flip-flops having different thresholds may be combined to provide a multi-bit output, or more traditional ADC components may be used to provide the data samples. Preferably the phase detector employs its own ADC components. Note, however, that the sampling instants of the data sampler 202 controlled by the clock generator 206 might not be the same sampling instants used in the transceiver for data recovery. But in some alternative embodiments, the ADC of the transceiver may be utilized by the pattern identifying logic circuit 204.

The pattern-identifying logic circuit 204 provides phase correction signals to the clock signal generator 206. The pattern-identifying logic circuit 204 receives data samples from the data sampler and only provides phase update signals if a predetermined data sample pattern is observed. Preferably, the predetermined data sample pattern is a specific sample sequence associated with desired timing information. The sequence may have any pattern, and be of arbitrary length. In one embodiment, the pattern-identifying logic circuit 204 includes combinational logic circuits that distinguish a one-to-zero transition from a zero-to-one transition, and only provides an update when the one-to-zero pattern is identified. In other embodiments the predetermined data sample pattern is preferably a one-to-zero transition preceded by an additional logic one sample. This is referred to herein as a one-one-zero pattern. In other embodiments, the transition may be a zero-to-one transition, and one-to-zero transitions will be ignored. In yet another alternative embodiment, the predetermined data sample pattern is preferably a zero-to-one transition preceded by an additional logic zero sample (a zero-zero-one transition). Further embodiments of the predetermined pattern include a rising edge followed by at least two ones (a zero-one-one transition), a falling edge followed by at least two zeros (a one-zero-zero transition), and a one-one-zero-zero or a zero-zero-one-one transition. One of ordinary skill in the art will appreciate that other predetermined sequences may be used. In a further embodiment, a subset of all possible transition sequences may be used. That is, a one-zero-zero and a zero-one-one may both be used (and other transition sequences not used, such as a one-zero-one and a zero-one-zero), or a one-one-zero-zero and a zero-zero-one-one may be used, but other sequences would not be used to provide a phase update.

Note that the phase detector data samples are only approximations of the received symbols, and that the observed one-one-zero data-sample pattern might not necessarily result from the transmission and reception of a one-one-zero symbol sequence. That is, under certain conditions, a symbol sequence of three ones followed by a zero will be required in order for a one-one-zero data-sample pattern to be observed.

The data signal sampler 202 generally provides signal samples of a received data signal at twice the symbol rate. The samples are preferably at a rate equal to twice the symbol rate so that samples of the data signal obtained near the mid-symbol time may be compared to samples of the data signal obtained during a symbol transition time. With reference to FIGS. 3A-3C, the data sampler is flip-flop 314 and flip-flop 318, which sample the data on line 310 on the rising and falling edges, respectively, of the clock signal on line 312. The data samplers 314, 318, each operate at the symbol rate with the sampling instants offset by one-half symbol. Taken together, data samplers 314, 318, provide symbol rate sampling. The flip-flops 316 and 320 allow the data samples to be shifted down and stored at the next rising edge of the clock on line 312. Together, flip flops 314, 316, 318 and 320 make up memory elements for storing the quantized data signal sample values.

With respect to FIG. 3A, the post processing logic circuit 330 includes XOR Gates 322, 324, and AND gates 326, 328. XOR Gates 322, 324 operate in a similar fashion the prior art Alexander phase detector such that it the outputs of flip-flops 314 and 316 are identical, indicating that no transition has occurred, the output is interpreted as a non-update, or the outputs are disabled. They may be disabled in this instance by conditioning the output on the nonoccurrence of a logic zero-zero or a logic one-one from flip-flops 314 and 316 (e.g., providing the symbol-spaced samples of flip-flops 314 and 316 to both a NOR gate and an AND gate, whose outputs are then ORed).

The logic circuit 330 operates on three data signal samples—a first and second signal sample from flip-flops 316 and 314 that are separated by a symbol period, and an intervening signal sample from flip-flop 320 that is obtained at a point between the first and second signal samples. The addition of AND gates 326, 328 provides for the pattern-dependent characteristics of the logic circuit. In particular, the phase update signals from XOR gates 322, 324, will only be enabled if the output of flip-flop 316 is a logic one. Logic circuit 330 therefore ensures that only transitions from one to zero are used to update the phase of the clock recovery circuit 200. Thus logic circuit 330 provides a pattern dependent phase update signal, which in this case is a one-to-zero transition pattern.

With respect to FIG. 3B, the addition of flip-flop 317 allows for the storage of an additional prior data sample. The logic circuit 332 therefore operates on four data samples, including three samples separated by a symbol period (the outputs of flip-flops 317, 316 and 314) and a fourth intervening sample (the output of flip-flop 320), preferably occurring between the second and third symbol-spaced samples (the outputs of flip-flops 314 and 316).

To identify the desired transition and obtain the pattern dependency, the data samples stored in flip-flops 316 and 317 are ANDed together by AND gate 331. The AND gates 327 and 329 provide phase update signals conditioned upon the output of AND gate 331. Thus the logic circuit 332 provides a pattern dependent phase update signal that requires both a one-zero transition as well as an additional preceding logic one data sample (i.e., a one-one-zero transition). The phase correction signal is referred to as a pattern-dependent phase correction signal because it is not generated for every signal transition that occurs, but only those that match the predetermined pattern, in this case a one-one-zero pattern.

With Respect to FIG. 3C, an additional data sampler 313 is provided, along with storage flip-flop 315. Flip-flop 313 is configured with a higher threshold value, and will therefore store a logic one only when the data signal on line 310 is above the higher threshold. AND gate 323 is provided to condition the phase update signals from OR gates 322, 324 (in combination with AND gates 333, 335) upon the detection of a transition from high to low, but only where the amplitude of the high signal is above the higher threshold of flip-flop 313. Note that the embodiment of FIG. 3C is not a standard multi-bit ADC in that a value of a logic one from flip-flop 313 and a value of a logic zero from flip-flop 314 is not possible. In alternative embodiments using multi-bit samples from standard ADC circuits, a threshold of the digitized samples may be determined such that phase updates will only be provided for transitions involving signals above the threshold. For example, in a two-bit ADC, the phase updates may be conditioned on the pattern involving a high to low transition, where a low is a "00" sample, and where the high sample value may be either a "11" sample or a "10" sample, but not a "01" sample.

Figure 4:
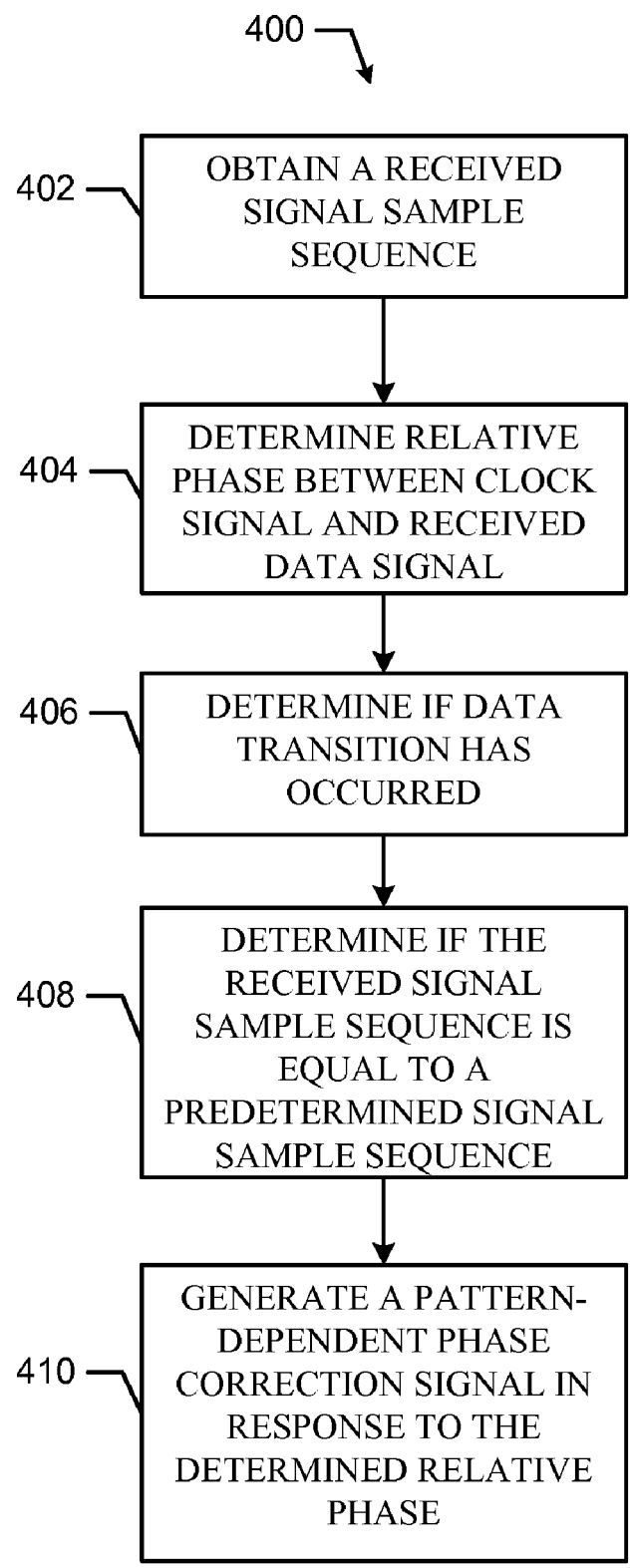
FIG. 4 is a flow chart of one preferred embodiment of a method for providing phase updates.

In an alternative embodiment, a method of providing phase correction signals to a clock signal generator is provided. The method is shown in FIG. 4, and preferably includes the step 402 of obtaining a received signal sample sequence; step 404, determining a relative phase between a clock signal and a received data signal in response to the received signal sample sequence; step 406, determining whether a data transition has occurred in response to the received signal sample sequence; step 408, determining whether the received signal sample sequence is equal to a predetermined signal sample sequence, and if so, step 410 generating a pattern dependent phase correction signal in response to the determined relative phase. In general, the steps may be performed in any sequence when possible. Furthermore, certain steps may be combined into a single action, such as steps 404, 406, 408 and 410 all being performed by a single combinational logic circuit. The steps are merely provided as a presentation of the operation of the logic circuits described herein.

As described above, step 402 may involve determining whether a received signal is above or below a first threshold. The threshold may be an analog one set by a flip-flop, or may be a digital threshold based on the quantized bit or bits. Also described above, more than one threshold may be utilized in the data sampler to obtain a multi-bit sample. Preferably, the received signal sample sequence includes samples taken at a rate equal to twice the symbol rate.

Step 404 includes comparing two samples separated by one symbol period with an intervening sample to see which one it matches. Step 406 is performed by comparing the samples separated by one symbol period. Again, this may require ensuring that a transition of sufficient magnitude has occurred, either by using modified thresholds or by using multi-bit quantizer values. In a preferred embodiment, only transitions from high to low are used to provide phase updates. In alternative embodiments, the low to high transition may be utilized.

Step 408 may include determining whether at least two samples separated by one symbol period, and which precede the data transition, have a high value. This transition is referred to herein as a one-one-zero transition.

In an alternative embodiment utilizing multi-bit samples, the method of providing phase correction signals to a clock signal generator may include the steps of (i) obtaining a received signal sample sequence, wherein the signal sample sequence contains at least some multi-bit samples; (ii) determining a relative phase between a clock signal and a received data signal in response to the received signal sample sequence; (iii) determining whether a predetermined data transition has occurred in response to the multi-bit samples, and, if so, (iv) generating a pattern dependent phase correction signal in response to the determined relative phase. In this embodiment, the step of determining whether a predetermined data transition has occurred may be performed by ensuring that the data transition involves a transition from the highest signal sample value to the lowest signal sample value.

An exemplary embodiment of the invention has been described above. Those skilled in the art will appreciate that changes may be made to the embodiment described without departing from the true spirit and scope of the invention as defined by the claims.

We claim:

1. An apparatus for providing phase correction signals to a clock signal generator, comprising:
 a data signal sampler that provides signal samples at twice a symbol-rate in response to a local clock signal, wherein the signal samples comprise at least a first signal sample and a second signal sample that are separated by a symbol period, and an intervening signal sample occurring between the first and second signal samples;
 a digital logic circuit for processing the first and second signal samples and the intervening signal sample to (i) identify the occurrence of at least one of 0 to 1 transitions and 1 to 0 transitions, (ii) generate a pattern-dependent phase correction signal upon the occurrence of only one of 0 to 1 transitions and 1 to 0 transitions.

2. The apparatus of claim 1 wherein the data signal sampler comprises a first and second memory element for storing the first signal sample and second signal sample, respectively, and a third memory element for storing the intervening signal sample.

3. The apparatus of claim 2 wherein the memory elements are flip-flops.

4. The apparatus of claim 3 wherein the first and second memory elements are triggered at a symbol rate by a first edge of a clock signal and the third memory element is triggered at a symbol rate by a second edge of a clock signal.

5. The apparatus of claim 4 further comprising a fourth memory element for storing a re-timed version of the intervening signal sample.

6. The apparatus of claim 1 wherein the digital signal sampler is a 1 bit analog to digital converter (ADC).

7. The apparatus of claim 6 wherein the 1 bit ADC comprises a thresholding device having a predetermined threshold.

8. The apparatus of claim 1 wherein the digital signal sampler is a multi-bit ADC.

9. The apparatus of claim 8 wherein the multi-bit ADC comprises two thresholding devices having different thresholds.

10. The apparatus of claim 1 wherein the signal samples further comprise a third signal sample separated from one of the first and second signal samples by a symbol period, and wherein the digital logic circuit processes the first, second and third signal samples to identify the occurrence of a predetermined signal transition.

11. The apparatus of claim 1 wherein the data signal sampler comprises a first sample path for sampling data on a rising edge of a clock signal, and a second path for sampling data on a falling edge of a clock signal.

12. A method of providing phase correction signals to a clock signal generator, comprising the steps of:
 (i) obtaining a received signal sample sequence;
 (ii) determining a relative phase between a clock signal and a received data signal in response to the received signal sample sequence;
 (iii) determining whether a data transition has occurred in response to the received signal sample sequence; and,
 (iv) determining whether the received signal sample sequence is equal to a predetermined signal sample sequence, and if so, generating a pattern dependent phase correction signal in response to the determined relative phase, wherein the predetermined signal sample sequence is a transition from 1 to 0.

13. The method of claim 12 wherein the step of obtaining a received signal sample sequence comprises determining whether a received signal is above or below a first threshold.

14. The method of claim 13 wherein the step of obtaining the received signal sample sequence further comprises determining whether the received signal is above or below a second threshold.

15. The method of claim 12 wherein the received signal sample sequence comprises samples taken at a rate equal to twice the symbol rate.

16. The method of claim 12 wherein the step of determining whether a transition has occurred comprises comparing samples separated by one symbol period.

17. The method of claim 12 wherein the step of determining whether a transition has occurred comprises determining that a high to low transition has occurred.

18. The method of claim 12 wherein the step of determining whether the received signal sample sequence is equal to a predetermined signal sample sequence comprises determining whether at least two samples separated by one symbol period precede the data transition.

19. A method of providing phase correction signals to a clock signal generator
comprising the steps:
 (i) obtaining a received signal sample sequence, wherein the signal sample sequence contains at least some multi-bit samples;
 (ii) determining a relative phase between a clock signal and a received data signal in response to the received signal sample sequence;
 (iii) determining whether a predetermined data transition has occurred in response to the multi-bit samples, wherein the predetermined data transition is a transition from one to zero, and, if so,
 (iv) generating a pattern dependent phase correction signal in response to the determined relative phase.

20. The method of claim 19 wherein the step of determining whether a predetermined data transition has occurred comprises insuring that the data transition involves a transition from the highest signal sample value to the lowest signal sample value.

* * * * *